United States Patent
Ospina Ramirez et al.

(10) Patent No.: US 10,345,349 B2
(45) Date of Patent: Jul. 9, 2019

(54) ANTI-POWER THEFT CABLES AND METHODS

(71) Applicant: General Cable Technologies Corporation, Highland Heights, KY (US)

(72) Inventors: Carlos Augusto Ospina Ramirez, Bogota (CO); Jared D. Weitzel, Cincinnati, OH (US)

(73) Assignee: General Cable Technologies Corporation, Highland Heights, KY (US)

( * ) Notice: Subject to any disclaimer, the term of this patent is extended or adjusted under 35 U.S.C. 154(b) by 0 days.

(21) Appl. No.: 15/827,692

(22) Filed: Nov. 30, 2017

(65) Prior Publication Data

US 2018/0156848 A1    Jun. 7, 2018

Related U.S. Application Data

(60) Provisional application No. 62/525,424, filed on Jun. 27, 2017, provisional application No. 62/429,168, filed on Dec. 2, 2016.

(51) Int. Cl.
| | | |
|---|---|---|
| *G02B 6/42* | (2006.01) | |
| *G01R 22/06* | (2006.01) | |
| *H01B 9/04* | (2006.01) | |
| *H01B 7/02* | (2006.01) | |
| *H01B 7/38* | (2006.01) | |
| *H01B 9/00* | (2006.01) | |

(52) U.S. Cl.
CPC ........... *G01R 22/066* (2013.01); *G02B 6/421* (2013.01); *H01B 7/0225* (2013.01); *H01B 7/38* (2013.01); *H01B 9/006* (2013.01); *H01B 9/04* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,359,598 A | * | 11/1982 | Dey | G02B 6/4403 174/40 R |
| 7,860,362 B2 | * | 12/2010 | Varkey | G02B 6/443 385/101 |
| 8,831,389 B2 | | 9/2014 | McCullough et al. | |
| 8,957,312 B2 | | 2/2015 | McCullough et al. | |
| 2006/0045442 A1 | * | 3/2006 | Varkey | G02B 6/4413 385/102 |

(Continued)

FOREIGN PATENT DOCUMENTS

| | | |
|---|---|---|
| CN | 203950605 U | 11/2014 |
| CN | 104733124 A | 6/2015 |

OTHER PUBLICATIONS

Thomas, Shane; International Search Report and Written Opinion of the International Searching Authority, issued in International App. No. PCT/US2017/063958; dated Feb. 2, 2018; 8 pages.

*Primary Examiner* — William H. Mayo, III
*Assistant Examiner* — Krystal Robinson
(74) *Attorney, Agent, or Firm* — Ulmer & Berne LLP

(57) ABSTRACT

A cable includes a core and a plurality of layers surrounding the core. In one embodiment, at least one of the layers surrounding the core includes multiple sets of phase conductors. The respective sets of phase conductors are electrically isolated from one another. Other cables are also provided.

20 Claims, 8 Drawing Sheets

(56) References Cited

U.S. PATENT DOCUMENTS

| | | | |
|---|---|---|---|
| 2006/0065429 A1* | 3/2006 | Kim | H01B 7/046 174/120 R |
| 2006/0137895 A1* | 6/2006 | Varkey | H01B 7/0291 174/113 R |
| 2006/0151194 A1* | 7/2006 | Varkey | H01B 7/046 174/102 R |
| 2006/0280412 A1* | 12/2006 | Varkey | G02B 6/4427 385/101 |
| 2007/0107928 A1* | 5/2007 | Varkey | H01B 7/046 174/102 R |
| 2008/0031578 A1* | 2/2008 | Varkey | E21B 47/123 385/100 |
| 2008/0118209 A1* | 5/2008 | Varkey | G02B 6/4486 385/101 |
| 2012/0082422 A1 | 4/2012 | Sarchi et al. | |
| 2012/0121224 A1* | 5/2012 | Dalrymple | E21B 17/023 385/101 |
| 2015/0233200 A1* | 8/2015 | Varkey | E21B 23/14 166/385 |
| 2018/0156848 A1* | 6/2018 | Ospina Ramirez | H01B 9/006 |

* cited by examiner

ANTI-POWER THEFT CABLES AND METHODS

REFERENCE TO RELATED APPLICATIONS

This application claims priority of U.S. provisional patent application Ser. Nos. 62/429,168 and 62/525,424, filed Dec. 2, 2016, and Jun. 27, 2017, respectively, and hereby incorporates each of these provisional patent applications by reference herein in its respective entirety.

TECHNICAL FIELD

The present disclosure relates to the field of power carrying cables.

BACKGROUND

Energy distribution companies are required to transfer electrical power from transformers to branching points via electricity distribution network cables. Often times, electrical power is diverted or robbed from the distribution network cables by unauthorized tapping of electrical power lines of such network cables. The amount of electrical power tapped illegally is not systematically billed, and therefore it causes heavy financial losses to the energy distribution companies.

SUMMARY

In accordance with one embodiment, a cable comprises a core, a first conductor layer, and a first insulation layer. The first conductor layer circumferentially surrounds the core. The first conductor layer comprises a first set of phase conductors, a second set of phase conductors, and at least two dielectric insulators. The first set of phase conductors is arranged in an arcuate configuration to form a first arc. The second set of phase conductors is arranged in an arcuate configuration to form a second arc. The at least two dielectric insulators are configured to electrically isolate the first arc from the second arc. The first insulation layer contacts and circumferentially surrounds the first conductor layer.

In accordance with another embodiment, a cable comprises a core and a plurality of layers surrounding the core. At least one of the layers surrounding the core comprises multiple sets of phase conductors. Each one of the multiple sets of phase conductors is electrically isolated from each of the other sets of phase conductors.

In accordance with yet another embodiment, a cable comprises a centrally-disposed support member, a first layer, at least two dielectric insulators, and a second layer. The first layer comprises a first set of phase conductors and a second set of phase conductors. The first set of phase conductors is arranged in an arcuate configuration to form a first arc. The second set of phase conductors is arranged in an arcuate configuration to form a second arc. The first arc and the second arc are configured to surround the support member. The at least two dielectric insulators are configured to electrically isolate the first arc from the second arc. The second layer surrounds the first layer and is configured to provide insulation to the first layer.

In accordance with still another embodiment, a cable comprises a core. A first set of conductors surrounds the core. A first insulation layer surrounds the first set of conductors. A second set of conductors surrounds the first insulation layer. A second insulation layer surrounds the second set of conductors. A third set of conductors surrounds the second insulation layer. A third insulation layer surrounds the third set of conductors.

BRIEF DESCRIPTION OF THE DRAWINGS

It is believed that the disclosed anti-power theft cable and methods will be better understood from the following description taken in conjunction with the accompanying drawings in which.

DETAILED DESCRIPTION

Selected embodiments are hereinafter described in detail in connection with the views and examples of FIGS. 1-16.

The present disclosure envisages several embodiments of an anti-power theft cable, also referred to interchangeably herein as power cables and coaxial insulating power cables, that can overcome the drawbacks of conventional power cables. An anti-power theft cable in accordance with embodiments of the present disclosure will now be described with reference to the accompanying embodiments which do not limit the scope and ambit of the disclosure. The description provided is purely by way of example and illustration.

Figure 1:
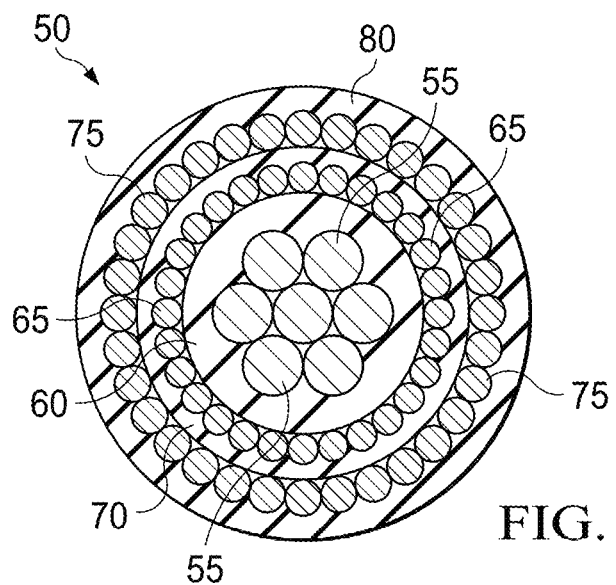
FIG. 1 is a cross-sectional view of an anti-power theft cable in accordance with a first embodiment of the present disclosure, such as for overhead installation of the anti-power theft cable.
Figure 2:
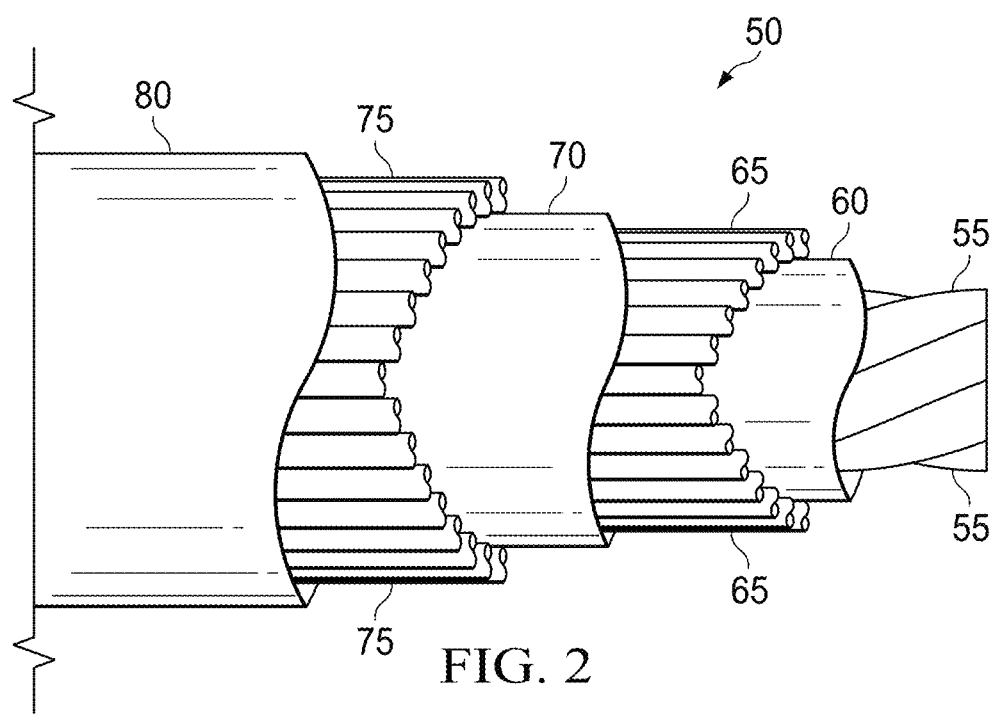
FIG. 2 is a side elevational view of the anti-power theft cable of FIG. 1.

FIG. 1 and FIG. 2 illustrate an anti-power theft cable 50, in accordance with a first embodiment of the present disclosure. The anti-power theft cable 50 has a coaxial structure and includes three conductor layers and an insulation layer for each of the conductor layers in order to prevent any contact therebetween. In particular, a first conductor layer 55 of the anti-power theft cable 50 is shown to have a plurality of phase conductors surrounded by a first insulation layer 60. A second conductor layer 65 of the anti-power theft cable 50 is shown to have a plurality of phase conductors surrounding the first insulation layer 60 and surrounded by a second insulation layer 70. A third conductor layer 75 of the anti-power theft cable 50 is shown to have a plurality of neutral conductors surrounding the second insulation layer 70 and surrounded by a third insulation layer 80. In one embodiment, the third insulation layer 80 can provide the outermost jacket of the anti-power theft cable 50. The first conductor layer 55, the second conductor layer 65, and the third conductor layer 75 can be concentrically circumscribed by the first insulation layer 60, the second insulation layer 70, and the third insulation layer 80, respectively, such as shown in FIGS. 1-2.

In one embodiment, the phase conductors of the first conductor layer 55 of the anti-power theft cable 50 can be made from aluminum or an aluminum alloy. These conductors can be configured to provide support to the anti-power theft cable 50 against the mechanical load subjected thereon, thereby facilitating effective overhead installation of the anti-power theft cable 50. In one embodiment, the phase conductors and the neutral conductors of the respective second conductor layer 65 and the third conductor layer 75 can be made from aluminum or an aluminum alloy. However, it will be appreciated that the phase conductors and the neutral conductors can be formed from any of a variety of other suitable materials such as copper, steel, alloys, and/or other metal(s).

The use of aluminum conductors in manufacturing of the anti-power theft cable 50 can overcome a drawback of certain conventional cables having copper conductors, by facilitating strengthening while reducing weight, and thus facilitating effective overhead installation of the anti-power theft cable 50. The anti-power theft cable 50 can thus be configured to withstand heavy mechanical stresses, and therefore can be effectively installed overhead.

An anti-power theft cable in accordance with a second embodiment of the present disclosure is shown and described with reference to FIGS. 3-11. In particular, FIGS. 3, 4 and 8-9 illustrate a coaxial insulating power cable 100, in accordance with a first variation of the second embodiment of the present disclosure. FIG. 5 is a cross-sectional view illustrating a coaxial insulating power cable 200, in accordance with a second variation of the second embodiment of the present disclosure. FIG. 6, FIG. 7, FIG. 10 and FIG. 11 are cross-sectional views illustrating still further variations of the second embodiment of the present disclosure.

Figure 3:
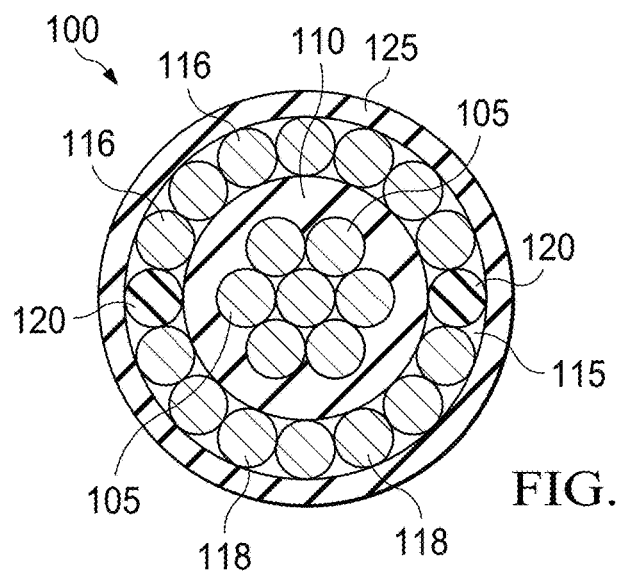
FIG. 3 illustrates a cross-sectional view of an anti-power theft cable in accordance with a second embodiment of the present disclosure.
Figure 4:
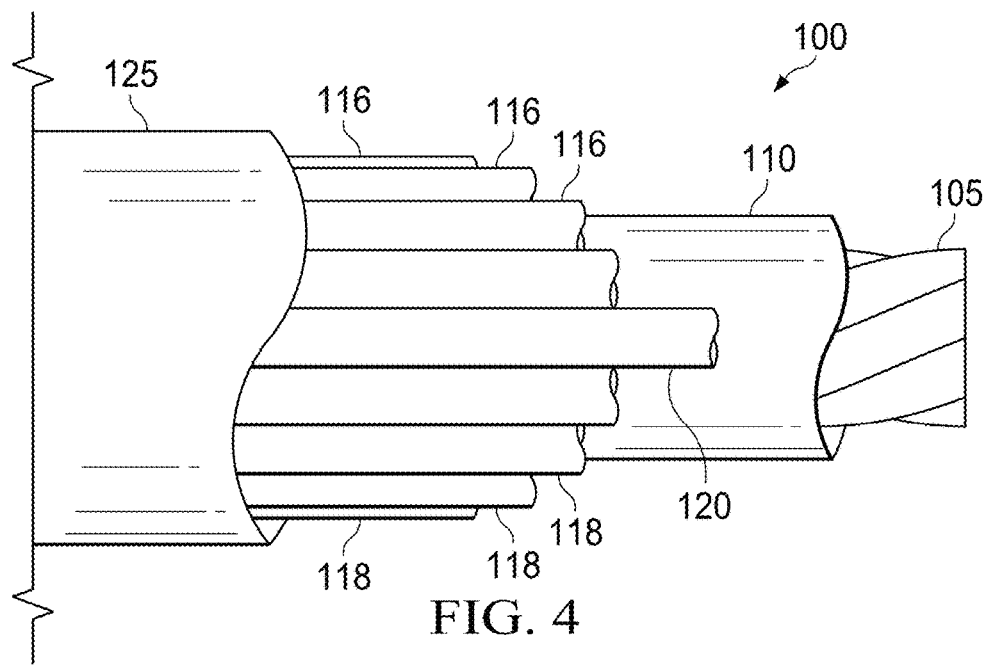
FIG. 4 is a side elevational view of the anti-power theft cable of FIG. 3.
Figure 5:
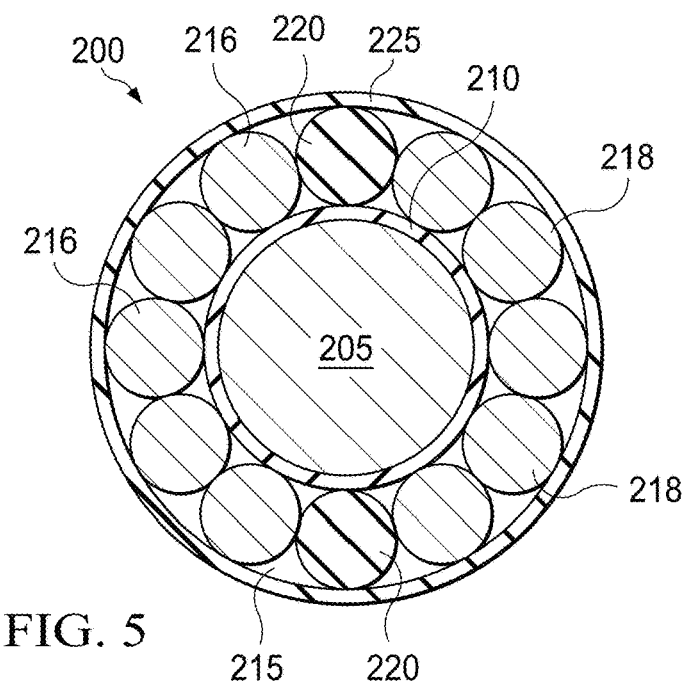
FIG. 5 is a cross-sectional view of an anti-power theft cable, in accordance with another embodiment of the present disclosure.

As shown in FIGS. 3-4, a coaxial insulating power cable 100 can have a multi-layered structure comprising a plurality of layers surrounding a bundle of bare conductors that forms an electrically conductive core 105. In one embodiment, the core 105 serves as a neutral conductor. The bare conductors forming the core 105 can be made from a material selected from the group consisting of aluminum, aluminum alloy, and the like. However, in another embodiment, the core 105 can include aluminum conductor steel-reinforced cables (ACSR). It will be appreciated that the core 105 can provide a phase conductor, a neutral conductor, or be non-conductive. It will be appreciated that the core 105 can be formed from any of a variety of other suitable materials such as copper, steel, metals, alloys, composites or otherwise.

The coaxial insulating power cable 100 is shown to comprise a first layer 110, a second layer 115 and a third layer 125. In one embodiment, the first layer 110, the second layer 115, and the third layer 125 concentrically circumscribe the core 105, the first layer 110, and the second layer 115 respectively.

The first layer 110, typically a neutral insulation layer, is shown to surround the core 105, and can be configured to provide insulation to the core 105. The insulating material used to cover the core 105 can either be extruded onto the core 105 or provided over the core 105 in the form of an insulating tape, for example. In an alternative embodiment, if the core is self-insulating or non-conductive, then the first layer 110 can be eliminated.

The second layer 115 of the coaxial insulating power cable 100 can include a first set of phase conductors 116 and a second set of phase conductors 118. The first set of phase conductors 116 can be arranged in an arcuate configuration thereby forming a first arc, whereas the second set of phase conductors 118 can also be arranged in an arcuate configuration to form a second arc, as shown in FIG. 3. In an embodiment of the present disclosure, the first arc and the second arc can be configured to surround any underlying layer, i.e. the first layer 110, as also shown in FIG. 3. Each of the first and second sets of phase conductors 116, 118 can be made from a material selected from the group consisting of copper, aluminum, aluminum alloy and the like. In the example of FIG. 3, the core 105 is shown to include seven wires, the first set of phase conductors 116 is shown to comprise eight wires, and the second set of phase conductors 118 is shown to comprise eight wires. However, it will be appreciated that a cable can alternatively include any of a variety of other suitable quantities of wires.

The second layer 115 can also include at least two dielectric insulators 120, such as shown in the example of FIG. 3. The at least two dielectric insulators 120 can be provided in the second layer 115 of the coaxial insulating power cable 100 in such a way that they separate the first arc of the first set of phase conductors 116 and the second arc of the second set of phase conductors 118, thereby preventing any unwanted contact between the first and second sets of phase conductors 116, 118. In an embodiment, the at least two dielectric insulators 120 are configured to electrically insulate the first set of phase conductors 116 and the second set of phase conductors 118. The at least two dielectric insulators 120 can have a circular, round, square, extruded, or any geometrical or non-geometrical shape. In one embodiment, the core 105 and the first and second sets of phase conductors 116, 118 can each define a respective conductor, such that the coaxial insulating power cable 100 comprises a three-conductor cable in a triplex configuration suitable for any of a large variety of uses, e.g., single phase center-tapped residential type service entrance, three phase delta type service, and the like.

The third layer 125 can surround the second layer 115 and can be configured to provide insulation to the second layer 115. The third layer 125 is shown to provide the outermost layer of the multi-layered coaxial insulating power cable 100, and thus to be an outer insulating jacket or phase insulation layer. The material used for making the third layer 125 of the power cable 100 can be selected on the basis of properties such as resistance to weathering, resistance to abrasion and tearing, high hardness, and mechanical strength.

The structure of the coaxial insulating power cable 100 can thus eliminate the need for three insulation layers as required in certain conventional cables, thus decreasing manufacturing cost and simplifying manufacturing and installation. Furthermore, the use of aluminum, aluminum alloys or composites in manufacturing certain embodiments of the coaxial insulating power cable 100, can overcome a drawback of certain conventional cables having copper conductors, as it facilitates strengthening and more effective overhead installation.

In a second variation of the second embodiment of the present disclosure, as shown in FIG. 5, a coaxial insulating power cable 200 can have a multi-layered structure comprising a support member 205 disposed at the center of the coaxial insulating power cable 200. In one embodiment, the support member 205 is made from a material selected from the group consisting of non-conducting or dielectric materials such as composites and composite alloys. In another embodiment, the support member 205 is made from a material selected from the group consisting of conducting or non-dielectric materials such as composites, composite alloys, insulated conductors, coated conductors, steel, aluminum, aluminum alloy, aluminum conductor steel-reinforced cable (ACSR), aluminum conductor steel supported cable (ACSS), or aluminum conductor aluminum alloy reinforced cable (ACAR). In another embodiment, the material used in making of the support member 205 is selected on the basis of its strengthening properties. It will be appreciated that the support member 205 can provide a phase conductor, a neutral conductor, or be non-conductive.

The coaxial insulating power cable 200 is shown to comprise a first layer 210, a second layer 215 and a third layer 225. In one embodiment, the first layer 210, the second layer 215, and the third layer 225 concentrically circumscribe the support member 205, the first layer 210, and the second layer 215, respectively.

The first layer 210 is shown in FIG. 5 to surround the support member 205 and to provide insulation to the support member 205, which can be particularly useful if the support member 205 is non-insulating. The insulating material used to cover the support member 205 can either be extruded onto the support member 205 or provided over the support member 205 in the form of an insulating tape, for example. In an alternative embodiment, if the support member 205 is self-insulating or non-conductive, then the first layer 210 can be eliminated. The second layer 215 of the coaxial insulating power cable 200 is shown to include a first set of phase conductors 216 and a second set of phase conductors 218, each having an arcuate configuration, thereby forming a first and a second arc, respectively. In an embodiment of the present disclosure, as shown in FIG. 5, the first arc and the second arc can be configured to surround any underlying layer, i.e., the first layer 210 or the support member 205. In the example of FIG. 5, the first set of phase conductors 216 is shown to comprise five wires, and the second set of phase conductors 218 is shown to comprise five wires. However, it will be appreciated that a cable can alternatively include any of a variety of other suitable quantities of wires. At least two dielectric insulators 220 can be provided in the second layer for separating the first and second arcs. In one embodiment, the third layer 225 can provide an outermost layer of the coaxial insulating power cable 200. The material, structure and configuration of the first layer 210, the second layer 215, the at least two dielectric insulators 220, and the third layer 225 can be similar in at least some respects to that described above with respect to the coaxial insulating power cable 100 of FIGS. 3-4.

Figure 6:
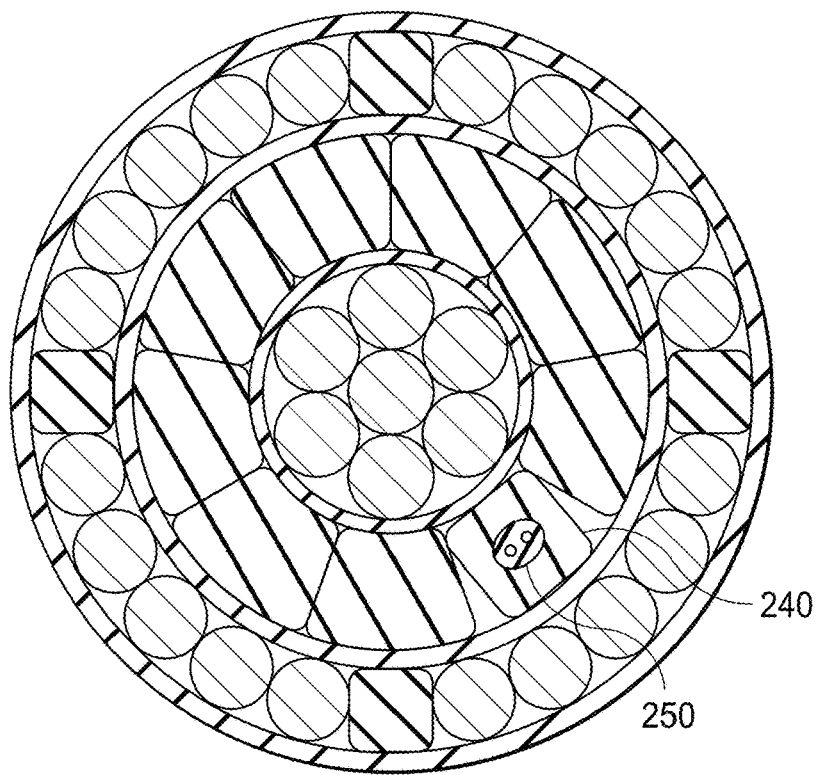
FIG. 6 is a cross-sectional view of an anti-power theft cable, in accordance with yet another embodiment of the present disclosure.

It will be appreciated that the quantity of dielectric insulators in the second layer of a power cable can be selected based upon the number of sets of phase conductors that are desired to be in the second layer. For example, in the embodiments described above having two sets of phase conductors in the second layer, it can be sufficient for the cable to include as few as two dielectric insulators. As another example, in an alternative embodiment, in which three sets of phase conductors are provided in the second layer (e.g., FIG. 14), it can be sufficient for the cable to include as few as three dielectric insulators. As yet another example, in an another alternative embodiment, in which four sets of phase conductors are provided in the second layer, it can be sufficient for the cable to include as few as four dielectric insulators, as shown in the example of FIG. 6. In any of these examples, additional dielectric separators can of course be provided.

In another embodiment (e.g., as in FIG. 15), a power cable can include one or more additional insulation layers to facilitate its inclusion of additional layers of phase conductors. In those configurations, dielectric insulators can optionally be provided to facilitate inclusion of multiple sets of phase conductors within such additional layer(s) of phase conductors.

Figure 7:
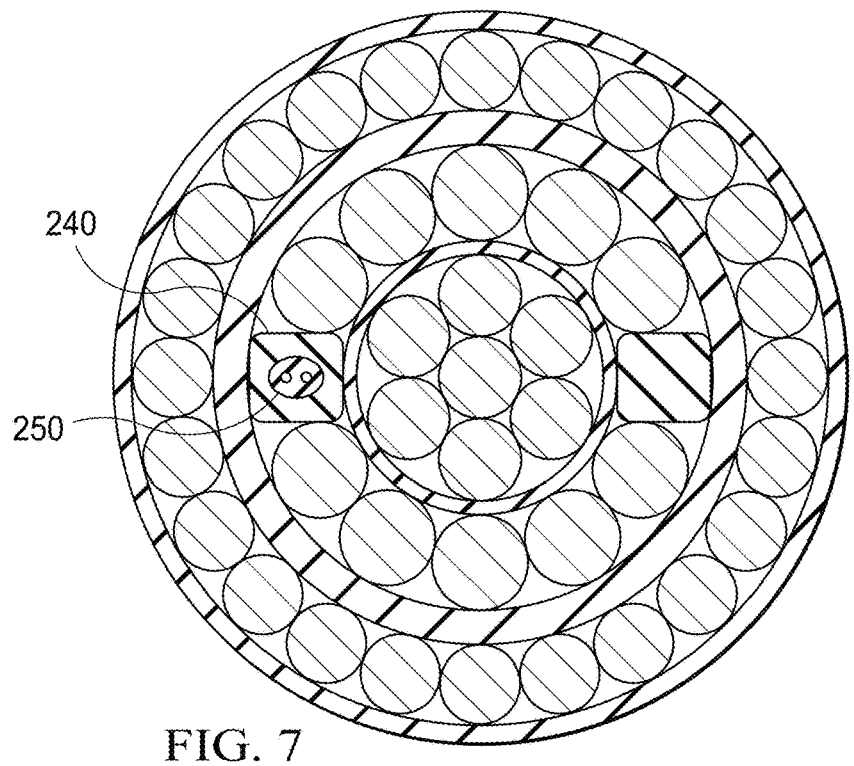
FIG. 7 is a cross-sectional view of an anti-power theft cable, in accordance with still another embodiment of the present disclosure.

In other embodiments, as shown in FIGS. 6-7, at least one dielectric insulator 240 provided within a cable can include a signal wire, fiber optic cable or other signal conductor 250 such as to facilitate a data communications purpose and/or to facilitate monitoring of the integrity of the cable. It will be appreciated that such an arrangement can be included within any of the other cable embodiments contemplated herein, including but not limited to those depicted in FIGS. 1-5 and 8-16.

It will be appreciated that the dimensions, shapes and materials of the various conductors of any of the power cables described herein can be selected to satisfy the particular intended applications of the power cables, such as to meet ampacity requirements, dimensional and weight requirements, and mechanical flexibility objectives. The conductors (phase and/or neutral) can have any regular or irregular shape. A few of the many possibilities of suitable shapes, sizes and configurations of conductors for particular power cables, are illustrated in FIGS. 1-16.

Figure 10:
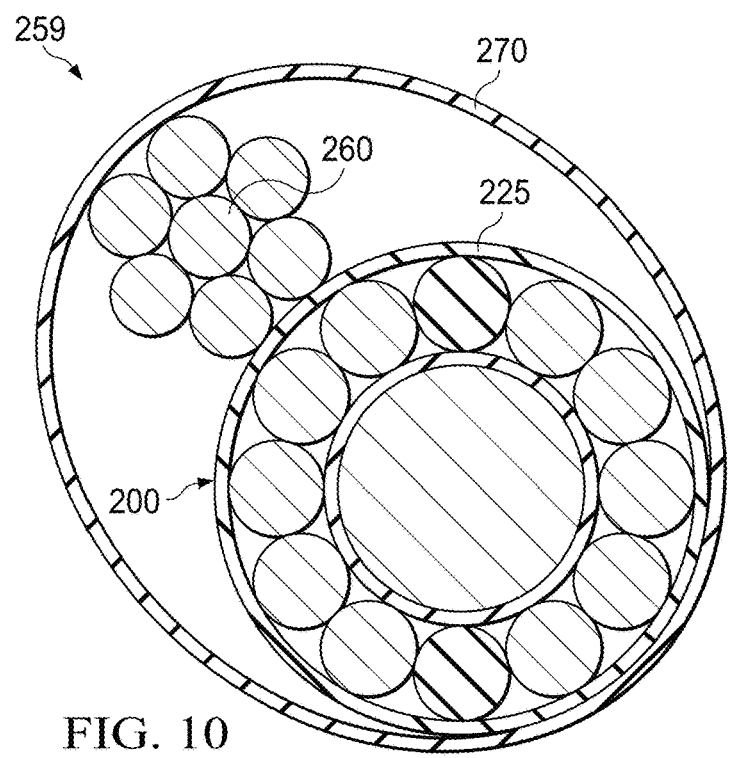
FIG. 10 is a cross-sectional view of an anti-power theft cable, in accordance with yet another embodiment of the present disclosure.
Figure 8:
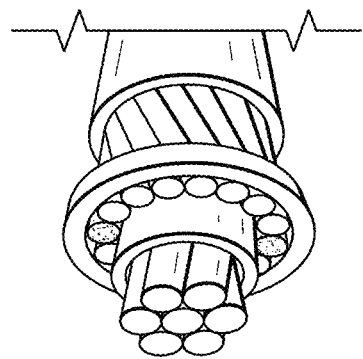
FIG. 8 is a photographic end perspective view generally depicting the anti-power theft cable of FIG. 3.
Figure 9:
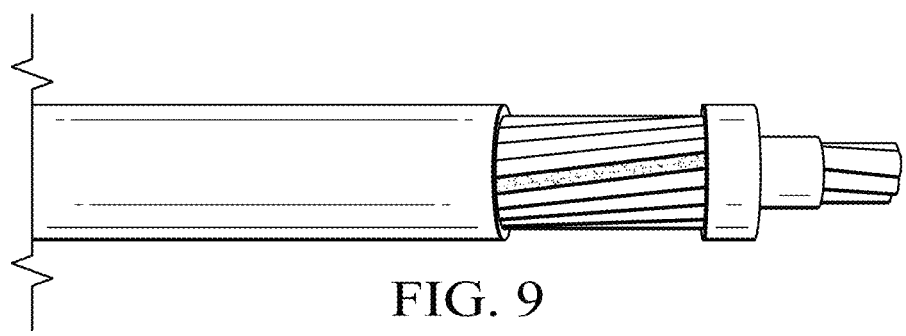
FIG. 9 is a photographic top side perspective view generally depicting the anti-power theft cable of FIG. 3.

In yet another variation of the second embodiment of the present disclosure, as shown in FIG. 10, a power cable 259 is shown to be formed by providing the coaxial insulating power cable 200 of FIG. 5 in combination with an outer conductor 260 and an outer wrapping 270. In one example, the outer conductor 260 can be a neutral conductor which is twisted and lashed about the exterior of the third layer 225 of the coaxial insulating power cable 200. In this arrangement, the outer wrapping 270 can provide an outermost layer of the power cable 259 of FIG. 10.

Figure 11:
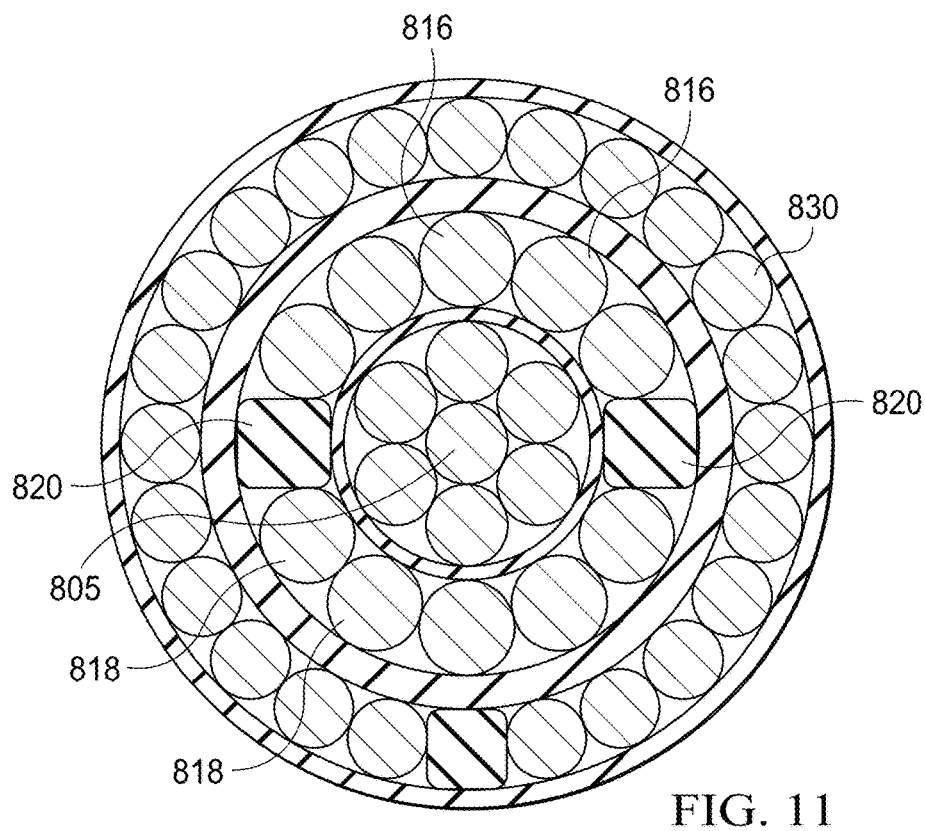
FIG. 11 is a cross-sectional view of an anti-power theft cable, in accordance with still another embodiment of the present disclosure.

In still another embodiment of the second embodiment of the present disclosure, as shown in FIG. 11, a power cable can include an ACSR neutral conductor core 805, a copper phase conductor 818 and a separate aluminum phase conductor 816 in a first layer, an aluminum phase conductor outer layer 830, and at least two dielectric insulators 820 provided in the first layer to separate and prevent contact between the copper phase conductor 818 and the aluminum phase conductor 816.

Figure 12:
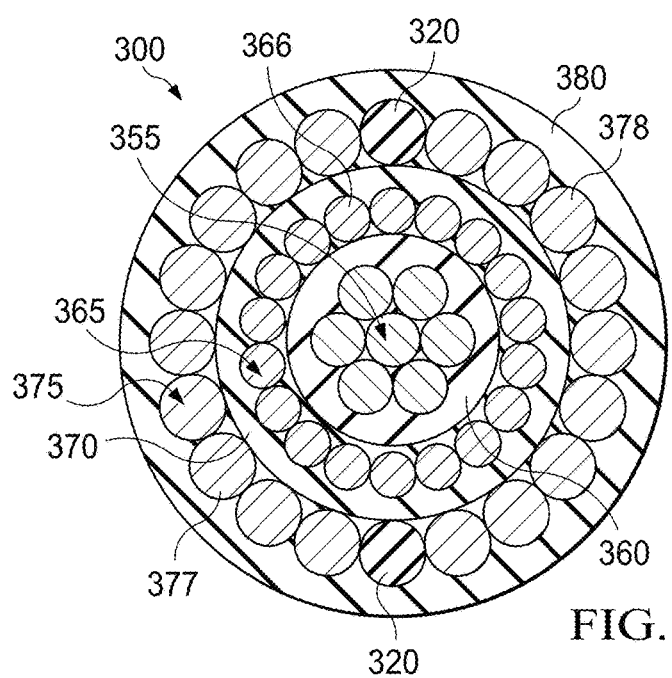
FIG. 12 is a cross-sectional view of an anti-power theft cable, in accordance with yet another embodiment of the present disclosure.

In another non-limiting practical embodiment of the present disclosure, as shown in FIG. 12, an anti-power theft cable 300 is shown to have a coaxial structure including three conductor layers and three insulation layers. In particular, a first conductor layer 355 of the power cable 300 is shown to have a plurality of neutral conductors disposed at the center of the power cable 300. The first conductor layer 355 is surrounded by a first insulation layer 360. A second conductor layer 365 of the power cable 300 is shown to have a first set of phase conductors 366 (Phase 1) surrounding the first insulation layer 360. The second conductor layer 365 is surrounded by a second insulation layer 370. A third conductor layer 375 of the power cable 300 is shown to include a second set of phase conductors 377 (Phase 2) and a third set of phase conductors 378 (Phase 3). The second set of phase conductors 377 (Phase 2) can be arranged in an arcuate configuration thereby forming a first arc, whereas the third set of phase conductors 378 (Phase 3) can also be arranged in an arcuate configuration to form a second arc, which together cooperate to surround the second insulation layer 370. At least two dielectric insulators 320 can be provided to separate the first arc of the second set of phase conductors 377 (Phase 2) from the second arc of the third set of phase conductors 378 (Phase 3), thereby preventing any unwanted contact between the second and third sets of phase conductors 377, 378 respectively.

The third conductor layer 375 is shown to be surrounded by a third insulation layer 380 which, in one embodiment, can serve as an outermost jacket of the power cable 300. In one embodiment, the first conductor layer 355, the second conductor layer 365, and the third conductor layer 375 are concentrically circumscribed by the first insulation layer 360, the second insulation layer 370, and the third insulation layer 380, respectively. In another embodiment, the first, second, and third insulation layers 360, 370, 380 are made from cross-linked polyethylene homopolymer or copolymer.

However, it will be appreciated that the first, second, and third insulation layers can alternatively be formed from any of a variety of other suitable materials.

In the example of FIG. 12, the first conductor layer 355 is shown to include seven wires, each having a diameter of 3.37 mm. In one example, each of these seven wires can be made from aluminum alloy 6201 wire and configured to serve as neutral conductors. The first set of phase conductors 366 is shown to comprise eighteen wires, each having a diameter of 2.75 mm. The second set of phase conductors 377 is shown to comprise ten wires, each having a diameter of 3.69 mm. Likewise, the third set of phase conductors 378 is shown to comprise ten wires, each having a diameter of 3.69 mm. Each of the first, second, and third set of phase conductors can be made from aluminum alloy 1350 wire. It will be appreciated that the size, quantity, material and arrangement of conductors can be selected from any of a variety of suitable possibilities, to form a cable in accordance with the present disclosure.

In one embodiment, the first conductor layer 355 of the power cable 300 can include neutral conductors made from aluminum or an aluminum alloy. These conductors can be configured to provide support to the—power cable 300 against the mechanical load subjected thereon, thereby facilitating overhead installation of the power cable 300. In one embodiment, the first, second, and third sets of phase conductors can be made from copper, aluminum or an aluminum alloy. The use of aluminum conductors in manufacturing of the power cable 300 can overcome a drawback of certain conventional cables having copper conductors, by facilitating strengthening and overhead installation of the power cable 300.

An anti-power theft cable in accordance with a third embodiment of the present disclosure is now described with reference to FIG. 13.

Figure 13:
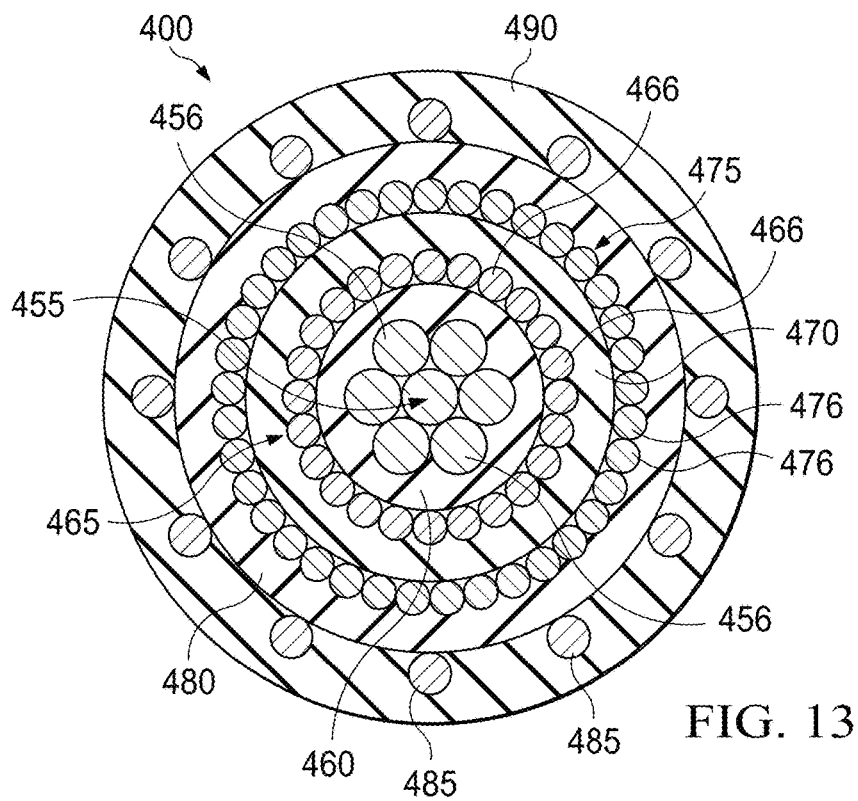
FIG. 13 is a cross-sectional view of an anti-power theft cable, in accordance with still another embodiment of the present disclosure.

In particular, a power cable 400 is shown in FIG. 13 to comprise a quadruplex cable having a multi-layered, coaxial structure. The power cable 400 is shown to include four conductor layers and four insulation layers. A first conductor layer 455 of the power cable 400 has a first set of phase conductors 456 (Phase 1) disposed at the center of the power cable 400, to form the core of the power cable 400. The first conductor layer 455 is surrounded by a first insulation layer 460. A second conductor layer 465 of the power cable 400 has a second set of phase conductors 466 (Phase 2) surrounding the first insulation layer 460. Further, the second conductor layer 465 is surrounded by a second insulation layer 470. A third conductor layer 475 of the power cable 400 has a third set of phase conductors 476 (Phase 3). The third conductor layer 475 surrounds the second insulation layer 470 and is surrounded by a third insulation layer 480. In this configuration, the third insulation layer 480 provides an inner jacket of the power cable 400 which is further surrounded by an external jacket, i.e. a fourth insulation layer 490. A plurality of neutral conductors 485 are shown to be disposed in a spaced apart configuration within the fourth insulation layer 490.

In this configuration, the first conductor layer 455, the second conductor layer 465, and the third conductor layer 475 are concentrically circumscribed by the first insulation layer 460, the second insulation layer 470, and the third insulation layer 480, respectively. The power cable 400 eliminates the need for dielectric insulators e.g., 120 in FIG. 3), as each layer of conductors (Phase 1, Phase 2, Phase 3, and neutral conductors) is provided with a separate insulation layer configured to avoid any contact between the separate conductor layers.

In the example of FIG. 13, the dimensions of all the conductors of the power cable 400 can be selected in accordance with ampacity requirements of the intended application of the power cable 400. The conductors (Phase 1, Phase 2, Phase 3, and/or neutral) of the power cable 400 can have any regular or irregular shape. The material of the phase conductors (Phase 1, Phase 2, and Phase 3) and neutral conductors can be selected from the group consisting of steel, aluminum, aluminum alloy, aluminum conductor steel-reinforced cable (ACSR), aluminum conductor steel supported cable (ACSS), and aluminum conductor aluminum alloy reinforced cable (ACAR). However, it will be appreciated that the material of the phase conductors and neutral conductors can be selected from any of a variety of other suitable materials such as copper, steel, alloys, and/or other metal(s). It will be appreciated that the size, quantity, material and arrangement of conductors can be selected from any of a variety of suitable possibilities, to form a cable in accordance with the present disclosure. It will be appreciated that the shape, size and material of respective conductors of a power cable can be similar, or can differ from one another.

In one particular example, as shown in FIG. 13, the first set of phase conductors 456 is shown to comprise seven wires, each having a diameter of 4.42 mm. The second set of phase conductors 466 is shown to comprise twenty four wires, each having a diameter of 2.38 mm. The third set of phase conductors 476 is shown to comprise thirty seven wires, each having a diameter of 1.95 mm. Each of the first, second, and third sets of phase conductors can be made from aluminum alloy 1350 wire. The plurality of neutral conductors 485 is shown to include twelve wires, each having a diameter of 2.67 mm. In one example, each of these twelve wires can be made from aluminum alloy 6201 wire.

The material for each of the sets of phase conductors can be selected at least in part on the basis of strengthening properties thereof. In an embodiment of the power cable 400, each of the first set of phase conductors 456 is made from aluminum or an aluminum alloy. This can facilitate strengthening of the power cable 400, support and resistance of the power cable 400 to mechanical load, and thus effective overhead installation thereof, thereby overcoming the drawback of the certain conventional cables.

The material used for making the fourth insulation layer 490, i.e., the external jacket of the power cable 400, can be selected to achieve desired performance characteristics in the intended embodiment of the power cable 400. Properties like resistance to weathering, resistance to abrasion and tearing, high hardness, and mechanical strength can be accounted for. In another embodiment of the power cable 400, one or more of the first, second, third, and fourth insulation layer 460, 470, 480, 490 are respectively made from cross-linked polyethylene homopolymer or copolymer.

The plurality of neutral conductors 485 is shown in FIG. 13 to be disposed at an outer periphery of the power cable 400. More specifically, the plurality of neutral conductors 485 is disposed in the external jacket, i.e., the fourth insulation layer 490 of the power cable 400. Therefore, in an attempt of theft of electrical power from the power cable 400 by means of a hook or spike for unauthorized tapping, no electrical power can be tapped as the plurality of neutral conductors 485 are not energized. Therefore, for unauthorized tapping, additional efforts are needed to reach the third set of phase conductors 476, which are energized conductors, but which are surrounded by the third insulation layer 480 and further by the plurality of neutral conductors 485. In an attempt of exposing the third set of phase conductors 476 for unauthorized tapping, there is a strong possibility of a short circuit of a phase conductor to neutral, which would result in tripping of a fuse or circuit breaker, and detection of the attempted theft. A similar result can occur if the hook or spike makes simultaneous contact with more than one phase conductor during tapping. Thus, an attempt of unauthorized tapping can be identified and prevented.

Figure 14:
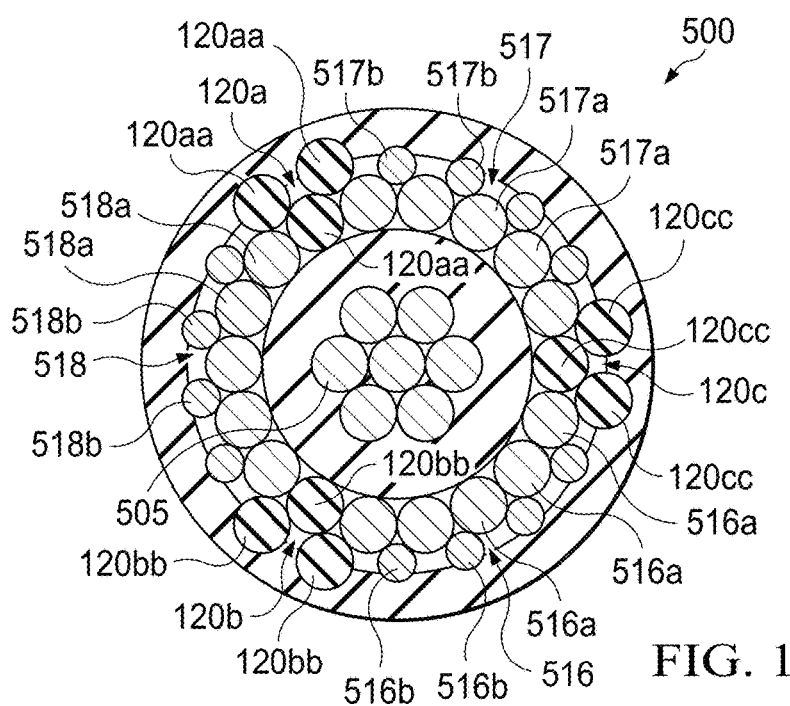
FIG. 14 is a cross-sectional view of an anti-power theft cable, in accordance with yet another embodiment of the present disclosure

FIG. 14 illustrates yet another alternative embodiment of a cable, in which a core 505 is surrounded by a second layer having first, second and third phase conductors 516, 517, 518 separated by respective dielectric insulators 120*a*, 120*b*, 120*c*. In one embodiment, as shown in FIG. 14, each of the dielectric insulators 120*a*, 120*b*, 120*c* can be formed from several (e.g., shown in each instance to be three) respective individual dielectric insulating members (e.g., 120*aa*, 120*bb*, 120*cc*). It will be appreciated that, by forming a dielectric insulator from several respective individual dielectric insulating members as shown in FIG. 14, versus from a single member, a cable can be manufactured more easily, less expensively, to be more flexible, to be more compact, and/or to have any of a variety of other desirable characteristics. In the example of FIG. 14, the first, second and third phase conductors 516, 517, 518 of the second layer are each shown to have a stacked configuration such that within the second layer, certain (516*a*, 517*a*, and 518*a*) of the respective conductors are circumferentially inwardly disposed and others (516*b*, 517*b*, and 518*b*) of the respective conductors are circumferentially outwardly disposed. In the example of FIG. 14, each of the conductors that are circumferentially inwardly disposed have a greater diameter than each of the conductors that are circumferentially outwardly disposed. Geometrically, it can be advantageous to stack conductors within a layer such as in this manner, such as to allow use of small diameter wires and thereby facilitate reduced overall outside diameter of the cable, increased overall flexibility of the cable, and/or other advantages. As in FIG. 14, in an embodiment in which the core is a conductor, the core and the first, second and third sets of phase conductors can each define a respective conductor, such that the cable comprises a four-conductor cable in a quadruplex type configuration suitable for any of a large variety of uses, e.g., three phase Y-type service, and the like.

Figure 15:
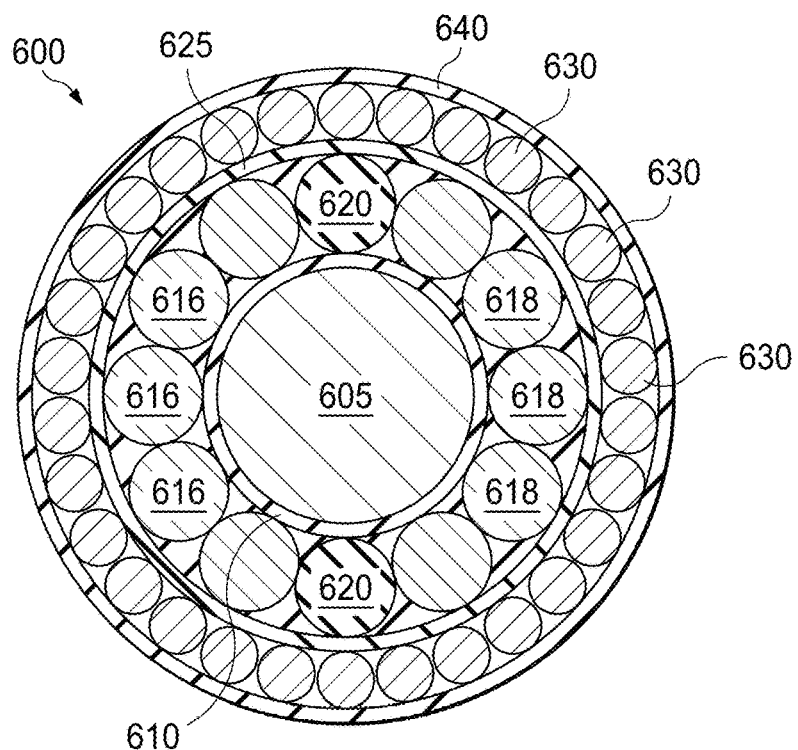
FIG. 15 is a cross-sectional view of an anti-power theft cable, in accordance with still another embodiment of the present disclosure.

FIG. 15 illustrates yet another alternative embodiment of a power cable 600, which is shown to be similar to coaxial insulating power cable 200 of FIG. 5, except that the power cable 600 includes an additional phase conductor layer and an additional insulation layer. More particularly, as shown in FIG. 15, the power cable 600 is shown to be a coaxially arranged, multi-layered structure. A core 605 of the power cable 600 is shown to be covered with a first insulation layer 610. A first set of phase conductors 616 and a second set of phase conductors 618 can be provided, each having an arcuate configuration, thereby forming a first arc and a second arc disposed about respective portions of the circumferential periphery of the first insulation layer 610. In the example of FIG. 15, the first set of phase conductors 616 is shown to comprise five wires, and the second set of phase conductors 618 is shown to comprise five wires, and two dielectric insulators 620 are shown to be separating the first and second arcs. Together, the first set of phase conductors 616, the second set of phase conductors 618, and the dielectric insulators 620 form a single layer which contacts and circumferentially surrounds the first insulation layer 610, and which itself is shown to be covered with a second insulation layer 625. A third set of phase conductors 630 is shown to include thirty wires which contact and together circumferentially surround the second insulation layer 625 and is itself covered with a third insulation layer 640.

In this configuration, each of the core 605, the first set of phase conductors 616, the second set of phase conductors 618, and the third set of phase conductors 630 can define a respective conductor, such that the power cable 600 defines a four-conductor cable in a quadruplex type configuration suitable for any of a large variety of uses, e.g., three phase Y-type service, and the like. Any of the core 605, the first set of phase conductors 616, the second set of phase conductors 618, and the third set of phase conductors 630 can define a neutral conductor. It will be appreciated that any of the first, second and third sets of phase conductors can include a different quantity of wires. While the core 605 is shown to comprise a single solid wire, it will be appreciated that a core can alternatively comprise a plurality of stranded wires. The first insulation layer 610, the second insulation layer 625, and the third insulation layer 640, in each instance, can either be extruded, provided in the form of an insulating tape or wrap, or otherwise provided. It will further be appreciated that dielectric separators can be included in any of a variety of suitable arrangements, configurations, and/or quantities, such as to facilitate a cable providing fewer or more than four conductors. It will also be appreciated that a cable can include additional layers of conductors and/or insulation to meet specific application criteria and requirements.

Figure 16:
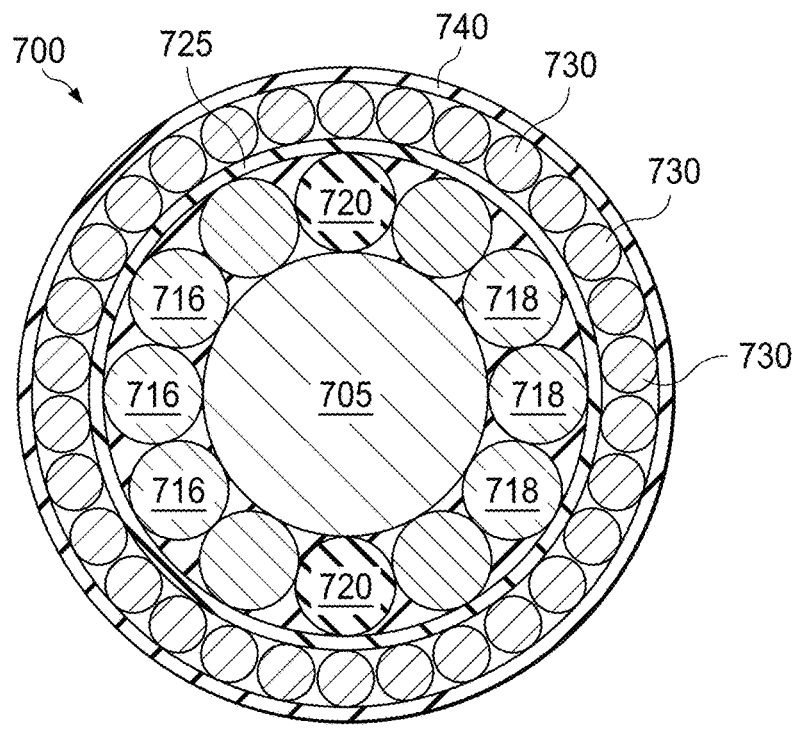
FIG. 16 is a cross-sectional view of an anti-power theft cable, in accordance with another embodiment of the present disclosure.

FIG. 16 illustrates yet another alternative embodiment of a power cable 700, which is shown to be similar to the power cable 600 of FIG. 15, except that a core 705 of the power cable 700 is not directly covered by an insulation layer (e.g., 610 of FIG. 15), such as when the core 705 is non-conductive. In such instance, the core can be formed from carbon fiber, fiberglass or another non-conductive material, and can provide support to the cable 700 against the mechanical load subjected thereon, thereby facilitating effective overhead installation. A first set of phase conductors 716 and a second set of phase conductors 718 can be provided, each having an arcuate configuration, thereby forming a first arc and a second arc disposed about respective portions of the circumferential periphery of the core 705. In the example of FIG. 15, the first set of phase conductors 716 is shown to comprise five wires, and the second set of phase conductors 718 is shown to comprise five wires, and two dielectric insulators 720 are shown to be separating the first and second arcs. Together, the first set of phase conductors 716, the second set of phase conductors 718, and the dielectric insulators 720 form a single layer which contacts and circumferentially surrounds the core 705, and which itself is shown to be covered with a first insulation layer 725. A third set of phase conductors 730 is shown to include thirty wires which contact and together circumferentially surround the first insulation layer 725 and is itself covered with a second insulation layer 740.

In this configuration, each of the first set of phase conductors 716, the second set of phase conductors 718, and the third set of phase conductors 730 can define a respective conductor, such that the power cable 700 defines a three-conductor cable in a triplex type configuration suitable for any of a large variety of uses, e.g., single phase center-tapped residential type service entrance, three phase delta type service, and the like. It will be appreciated that any of the first, second and third sets of phase conductors can include a different quantity of wires. The first insulation layer 725 and the second insulation layer 740, in each instance, can either be extruded, provided in the form of an insulating tape or wrap, or otherwise provided. It will further be appreciated that dielectric separators can be included in any of a variety of suitable arrangements, configurations, and/or quantities, such as to facilitate a cable providing fewer or more than three conductors. It will also be appreciated that a cable can include additional layers of conductors and/or insulation to meet specific application criteria and requirements.

It will be appreciated that, by merely looking at an outer jacket of a cable in accordance with the present disclosure, a thief may be unable to identify the position of conductors within the cable. In an attempt of theft of electrical power from a power cable of the present disclosure, by means of a hook or spike for unauthorized tapping, the penetrating point of the hook or spike makes simultaneous contact with more than one phase conductor, or simultaneous contact with both a phase conductor and a neutral conductor. Such simultaneous contact can result in a short circuit, and thus tripping of an associated fuse or circuit breaker, and resultant shutting off transmission of power. This shutting off of power can also facilitate detection of the attempted theft. Any of the cables described herein can be used for any of a variety of suitable applications, such as for example: (i) secondary distribution of utilities, (ii) connection from transformer to distribution box, and for (iii) service drop and entrance cables. The term 'cable' herein refers to a current carrying conductor that can have a single strand or multiple strands. In accordance with one embodiment, the anti-power theft cable of the present disclosure can have a reduced diameter, can withstand heavy mechanical stresses, can require less material, and/or can be easier to manufacture and install, as compared with alternative cable configurations.

The foregoing disclosure has been described with reference to the accompanying embodiments which do not limit the scope and ambit of the disclosure. The description provided is purely by way of example and illustration. It will be appreciated that any of the features or benefits described or shown with respect to one embodiment or variation, can be used in connection with another embodiment or variation.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the embodiments, it will be appreciated that many embodiments can be made and that many changes can be made in the embodiments without departing from the principles of the disclosure. These and other changes in the embodiments of the disclosure will be apparent to those skilled in the art from the disclosure herein, whereby it is to be distinctly understood that the foregoing descriptive matter is to be interpreted merely as illustrative of the disclosure and not as a limitation.

The foregoing description of embodiments and examples has been presented for purposes of illustration and description. It is not intended to be exhaustive or limiting to the forms described. Numerous modifications are possible in light of the above teachings. Some of those modifications have been discussed, and others will be understood by those skilled in the art. The embodiments were chosen and described in order to best illustrate principles of various embodiments as are suited to particular uses contemplated. The scope is, of course, not limited to the examples set forth herein, but can be employed in any number of applications and equivalent devices by those of ordinary skill in the art.

What is claimed is:

1. A cable comprising:
   a core;
   a first conductor layer circumferentially surrounding the core, wherein the first conductor layer comprises:
   a first plurality of wires arranged in an arcuate configuration to form a first arc, each wire of the first plurality of wires contacting an immediately adjacent wire of the first plurality of wires;
   a second plurality of wires arranged in an arcuate configuration to form a second arc, each wire of the second plurality of wires contacting an immediately adjacent wire of the second plurality of wires; and at least two dielectric insulators configured to electrically isolate the first arc from the second arc; and a first insulation layer contacting and circumferentially surrounding the first conductor layer.

2. The cable of claim 1 further comprising a core insulation layer, wherein:
the core is formed of a conductive material; and
the core insulation layer contacts and circumferentially surrounds the core.

3. The cable of claim 2 wherein each of the first plurality of wires, the second plurality of wires, and each of the at least two dielectric insulators contacts the core insulation layer.

4. The cable of claim 3 further comprising:
a second conductor layer, wherein the second conductor layer comprises a third plurality of wires which contact and circumferentially surround the first insulation layer; and
a second insulation layer, wherein the second insulation layer contacts and circumferentially surrounds the second conductor layer.

5. The cable of claim 2 further comprising:
a second conductor layer, wherein the second conductor layer comprises a third plurality of wires; and
a second insulation layer, wherein the second insulation layer circumferentially surrounds the second conductor layer.

6. The cable of claim 5 wherein the third plurality of wires circumferentially surrounds the first insulation layer.

7. The cable of claim 6 wherein the third plurality of wires contacts the first insulation layer.

8. The cable of claim 2, wherein the core is made from a material selected from the group consisting of steel, aluminum, aluminum alloy, aluminum conductor steel-reinforced cable (ACSR), aluminum conductor steel supported cable (ACSS), and aluminum conductor aluminum alloy reinforced cable (ACAR).

9. The cable of claim 1 wherein the core is formed of a non-conductive material.

10. The cable of claim 9 wherein each of the first plurality of wires, the second plurality of wires, and each of the at least two dielectric insulators contacts the core.

11. The cable of claim 10 further comprising:
a second conductor layer, wherein the second conductor layer comprises a third plurality of wires which contact and circumferentially surround the first insulation layer; and
a second insulation layer, wherein the second insulation layer contacts and circumferentially surrounds the second conductor layer.

12. The cable of claim 9 further comprising:
a second conductor layer, wherein the second conductor layer comprises a third plurality of wires; and
a second insulation layer, wherein the second insulation layer circumferentially surrounds the second conductor layer.

13. The cable of claim 12 wherein the third plurality of wires circumferentially surrounds the first insulation layer.

14. The cable of claim 13 wherein the third plurality of wires contacts the first insulation layer.

15. The cable of claim 1, wherein at least one of the at least two dielectric insulators comprises a fiber optic cable.

16. A cable comprising:
a first layer comprising:
a first plurality of wires arranged in an arcuate configuration to form a first arc, each wire of the first plurality of wires contacting an immediately adjacent wire of the first plurality of wires;
a second plurality of wires arranged in an arcuate configuration to form a second arc, each wire of the second plurality of wires contacting an immediately adjacent wire of the second plurality of wires; and
at least two dielectric insulators configured to electrically isolate the first arc from the second arc; and
a second layer surrounding the first layer and configured to provide insulation to the first layer.

17. The cable of claim 16 further comprising a support member and a support member insulation layer, wherein:
the support member is formed of a conductive material; and
the support member insulation layer contacts and circumferentially surrounds the support member.

18. The cable of claim 17, wherein the support member insulation layer, the first layer, and the second layer concentrically circumscribe the support member, the support member insulation layer, and the first layer, respectively.

19. A cable comprising:
a core;
a first plurality of wires surrounding the core, each wire of the first plurality of wires contacting an immediately adjacent wire of the first plurality of wires;
a first insulation layer surrounding the first plurality of wires;
a second plurality of wires surrounding the first insulation layer, each wire of the second plurality of wires contacting an immediately adjacent wire of the second plurality of wires;
a second insulation layer surrounding the second plurality of wires;
a third plurality of wires surrounding the second insulation layer, each wire of the third plurality of wires contacting an immediately adjacent wire of the plurality of third wires; and
an outer jacket surrounding the third plurality of wires such that the third plurality of wires are the circumferentially outermost wires of the cable, wherein:
the first plurality of wires is configured to facilitate delivery of electrical power at a first phase;
the second plurality of wires is configured to facilitate delivery of electrical power at a second phase; and
the third plurality of wires is configured to be electrically coupled with an electrical ground.

20. The cable of claim 19 further comprising:
a fourth plurality of wires surrounding the second insulation layer and contacting the second insulation layer, each wire of the fourth plurality of wires contacting an immediately adjacent wire of the fourth plurality of wires; and
a fourth insulation layer surrounding the fourth plurality of wires and interposed between the second plurality of wires and the third plurality of wires, wherein the fourth plurality of wires is configured to facilitate delivery of electrical power at a third phase.

* * * * *